United States Patent [19]
Lu et al.

[11] Patent Number: 6,100,183
[45] Date of Patent: Aug. 8, 2000

[54] METHOD FOR FABRICATING A VIA

[75] Inventors: William Lu, Tai-Ping; Tsung-Yuan Hung, Tainan; Chi-Cheng Yang, Hsinchu; Ching-Hsing Hsieh, Pingtung Hsien, all of Taiwan

[73] Assignee: United Semiconductor Corp., Hsinchu, Taiwan

[21] Appl. No.: 09/132,384

[22] Filed: Aug. 11, 1998

[30] Foreign Application Priority Data

May 29, 1998 [TW] Taiwan ................................. 87108390

[51] Int. Cl.$^7$ ................................................. H10L 21/283
[52] U.S. Cl. ........................... 438/637; 438/622; 438/627; 438/689; 438/704
[58] Field of Search .................... 438/637, 627, 438/622, 689, 704

[56] References Cited

U.S. PATENT DOCUMENTS 5,932,487 8/1999 Lou et al. ............................... 438/692

*Primary Examiner*—Charles Bowers
*Assistant Examiner*—Lisa Kilday
*Attorney, Agent, or Firm*—Thomas, Kayden, Horstemeyer & Risley

[57] ABSTRACT

A method for fabricating a via that uses a hard etching mask for etching the via. A photoresist layer used to pattern the hard etching mask is removed before starting the via etching. The hard etching mask includes a TiN etching mask, a silicon nitride etching mask, and a oxide/TiN etching mask. For each different etching mass, the TiN etching mask is not necessarily removed after etching; the silicon nitride etching mask is removed after etching; the oxide layer in the oxide/TiN etching mask is sacrificial layer.

19 Claims, 4 Drawing Sheets

METHOD FOR FABRICATING A VIA

CROSS-REFERENCE TO RELATED APPLICATION

This application claims the priority benefit of Taiwan application Ser. No. 87108390, filed May 29, 1998, the full disclosure of which is incorporated herein by reference.

BACKGROUND OF THE INVENTION

1. Field of the Invention

This invention relates to a method for fabricating a via, and more particularly to a method for fabricating a via which can prevent via poisoning.

2. Description of Related Art

For semiconductor devices fabricated in very large scale integration (VLSI) technology, that is, within an area of 1–2 $cm^2$, there are several hundred thousand transistors fabricated together. In order to achieve this kind of high integration fabrication, the density of interconnecting metal lines for connecting transistors is accordingly increased. In this case, using a single metal layer in the design is no longer adequate for interconnecting the transistors. It has instead gradually become a common strategy in the design of integrated circuits (ICs) to use at least two metal layers. Inter-metal dielectric layers are interposed between these metallic multiple layers, to isolate them. On an inter-metal dielectric layer, there is usually at least one via formed to reserve a space to connect these metallic multiple layers, in which a conductive material fills the via to form a plug and also forms the metal layer over the inter-metal dielectric layer. Through the plug, different metal layers are electrically coupled.

As the device dimensions get smaller, the device's increasing RC time delay becomes a performance-limiting factor. Materials with a low dielectric constant, such as the dielectric constant K is less that 4 can be integrated into devices to reduce the RC time delay and thereby improve device performance.

Recently, flowable oxide (FOx™), a compound of hydrogen silsesquioxane (HSQ) manufactured by Dow Corning Corp. has been used to form the inter-metal dielectric layers. Fox, having low K of about 3, has a K smaller than the usual quantity of about 3.8–4.0 so that it is quite suitable for gap-filling, such as filling the via, and has gradually become a commonly used material in VLSI fabrication.

Because of the low dielectric constant of FOx, the problem of parasitic capacitance is reduced. The RC time delay therefore becomes shorter, and the device performance speed is higher. This low-K material has been successfully applied in sub-half-micron technology.

Although FOx has the advantages mentioned above, it has the drawback of being hydrophilic, and is therefore easily affected by humidity, reacting with water during the fabrication procedure to form a poisoned via. The successful application of FOx as an inter-metal dielectric after coating and curing depends on (1) exhaustive preservation of the Si-H bond content, (2) prevention of moisture absorbtion, and (3) careful tuning of via etching process, which includes oxygen plasma ashing and wet chemical stripping to have less degradation to the FOx layer and preserve its low-K property after subsequent processing. Of these above three, the oxygen plasma ashing and wet chemical stripping used in conventional photoresist-mask patterning technology are found to be the most likely to degrade and impair the dielectric property of the FOx material. The careful selection of oxygen plasma ashing and wet chemical stripping processes can lessen the degradation of the FOx material however, the surface of the FOx layer will inevitably be damaged.

The damage inside the via does not have to be a problem, since a low dielectric constant is mainly needed between interconnecting metal lines. Even so, the moisture absorption by the damaged FOx inside the via can create a poisoned via during subsequent high temperature plug-filling process.

FIGS. 1–3 are cross sectional views schematically illustrating the fabrication of a conventional via. The like reference numbers have like materials in FIGS. 1–3.

In FIG. 1, there are a semiconductor substrate 10, a metal layer 12, an oxide layer 14, a FOx layer 15, a glue layer 16, and a tungsten (W) conductive layer 18. Surface damage 19 of the via 20 is shown. A void 17, which causes the via 20 to be poisoned, is formed because the moisture absorbed by the FOx layer 15 is released during subsequent high temperature plug-filling process and, therefore, the W conductive layer 18 can not fully fill the via 20.

Referring to FIG. 2, in order to avoid forming a poisoned via 20 due to a void 17 as shown in FIG. 1, or a volcano-like structure due to an explosion of bubbles during deposition of the W conductive layer 18, furnace baking and degassing processes are necessary to get rid of absorbed moisture in the exposed FOx material inside a via 21 before the glue layer 16 is deposited. The glue layer 16, including Ti/TiN, is deposited before the W conductive layer 18 plug-fill is formed. The degassing process can be finished in a degassing chamber and then the whole chip/wafer/piece/operation can be vacuum-transferred to Ti/TiN sputter deposition chambers of the same sputter-machine mainframe without absorbing more moisture due to vacuum-break. A robust and unpoisoned via 21 is therefore formed.

In the case of FIG. 2 described above, the method for preventing via poisoning is suitable for a technology with a dimension of 0.35 $\mu$m but is not suitable for a technology with a dimension smaller than 0.25 $\mu$m. It is limited by the formation of a photolithography window. An unlanded via fabrication process is needed to replace the formation of the photolithography window. Because the alignment of the via in the unlanded fabrication process is not strictly required, that the via is allowed to have a little portion the does not overlap the metal layer.

In FIG. 3, an unlanded via 22 is not fully formed over the metal layer 12. In this case, the inner surface of the unlanded via 22 exposes a large area of the damaged FOx layer. Although proper furnace baking and degas processes are performed, the only effect is releasing the absorbed moisture. The FOx layer could be punched through during subsequent etching to form the unlanded via 22. Furthermore, the profile of the unlanded via 22 cannot be properly maintained. The unlanded via 22 is then inevitably poisoned during the subsequent processes of forming the glue layer 16 and etching back.

SUMMARY OF THE INVENTION

It is therefore an objective of the present invention to provide a method for fabricating an unpoisoned via to prevent via poisoning in the conventional fabrication method.

In accordance with the foregoing and other objectives of the present invention, the method for fabricating a non-poisoned via uses a hard etching mask for etching the via. In the method of the invention, it is to prevent the FOx from being exposed to the environments of oxygen plasma ashing and wet chemical stripping that the photoresist is removed before performing the etching to form the via. Therefore the poisoned via and other related problems can be avoided.

In the foregoing, the hard etching mask includes a TiN conductive layer, a silicon nitride layer, and a $SiO_2$/TiN layer. The TiN conductive layer in the etching mask is not necessarily removed after etching is completed and can be combined together with a Ti/TiN glue layer to form a glue/barrier layer for a W plug. The silicon nitride layer in the etching mask is for etching an inter-metal dielectric layer has a wide selectivity and is removed after etching. The $SiO_2$ layer in the $SiO_2$/TiN etching mask is sacrificed so that a simple, low cost etching process can be used. Furthermore, the TiN layer in the $SiO_2$/TiN etching mask can also be preserved to be combined with the Ti/TiN glue layer to form a glue/barrier layer for the W plug.

BRIEF DESCRIPTION OF DRAWINGS

The invention can be more fully understood by reading the following detailed description of the preferred embodiments, with reference made to the accompanying drawings as follows.

DETAILED DESCRIPTION OF PREFERRED EMBODIMENT

EXAMPLE 1

FIGS. 4A–4D are cross sectional views of a via of a first preferred embodiment of the invention schematically illustrating the fabrication flow. The like reference numbers represent like objects.

Figure 1:
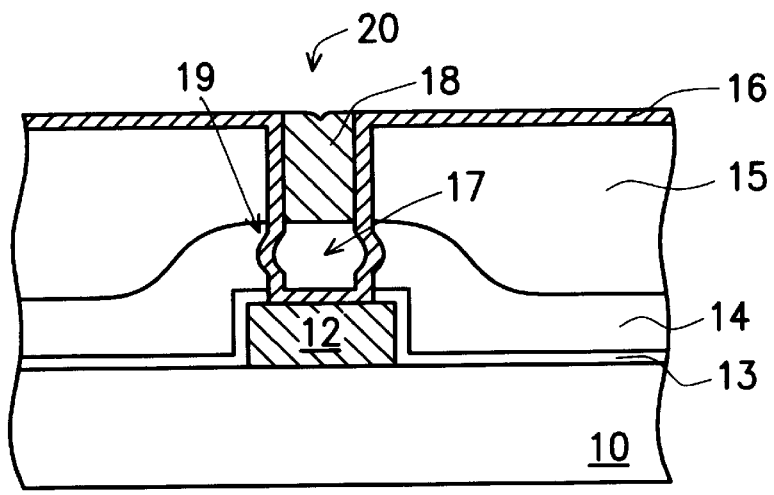
FIGS. 1–3 are cross sectional views schematically illustrating the fabrication of a conventional via.
Figure 2:
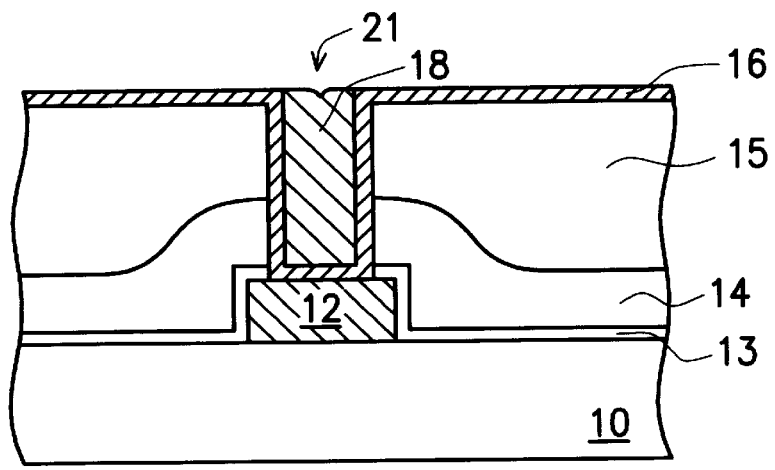
Figure 3:
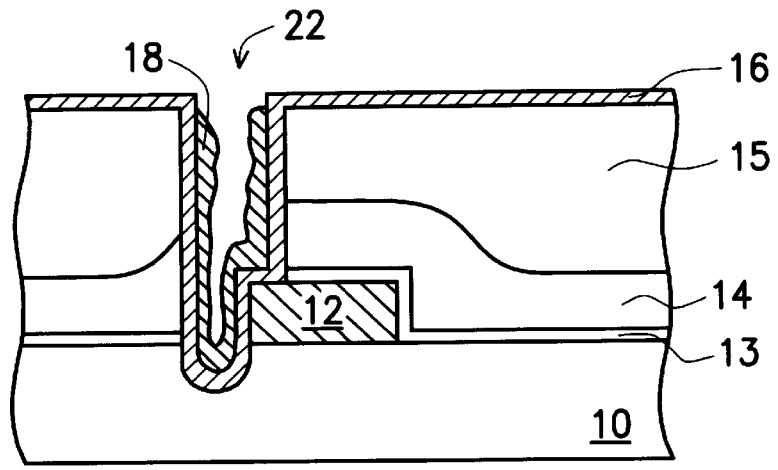
Figure 4A:
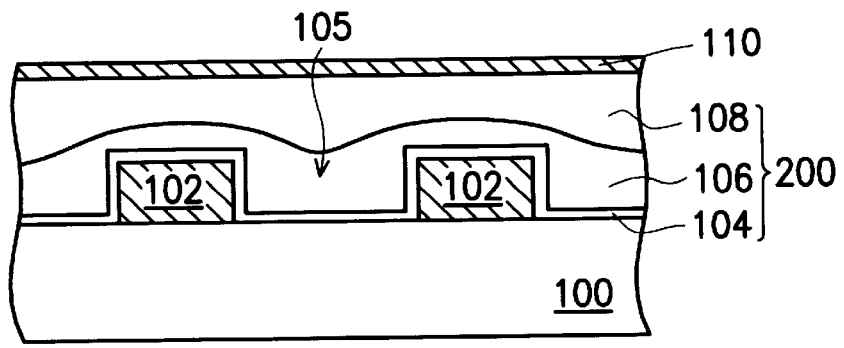
FIGS. 4A–4D are cross sectional views of a via of a first preferred embodiment of he invention schematically illustrating the fabrication flow.

In FIG. 4A, a metal layer 102 with an opening 105 is formed over a semiconductor substrate 100 through conventional photolithography and etching. A metal oxide semiconductor (MOS) device (not shown) is under the metal layer 102.

Then, a liner oxide layer 104 is formed over the substrate 100 in order to provide better adhesion and isolation. The liner oxide layer 104 preferably includes $SiO_2$ with a thickness of about 2000 Å and is formed using plasma enhanced chemical vapor deposition (PECVD).

Then, a FOx layer 106 is formed over the liner oxide layer 104 using conventional coating technology with a preferred thickness of about between 3000 Å and 5000 Å.

Because the FOx layer 106 still contains extra solution and has an uneven surface, it needs to be treated by melting and thermal flowing processes. Then the FOx layer 106 is cured in a furnace under an $N_2$ environment at a temperature of about 400° C.

Next an oxide layer 108 is formed over the FOx layer 106 preferably through PECVD with a thickness of about between 0.5 micron and 2 microns. If a planarization process is necessary after the FOx layer 106 is deposited, then the thickness of the FOx layer 106 is preferably refined to about 1~2 micron. A chemical mechanical polishing process is preferably performed to obtain planarization. After planarization polishing, an inter-metal dielectric layer 200 is formed with a thickness of about between 0.8 micron and 2 microns, in which the inter-metal dielectric layer 200 is composed of the liner oxide layer 104 the FOx layer 106, and the oxide layer 108.

The purpose of forming the oxide layer 108 is to provide better adhesion for a conductive layer 110 subsequently deposited on it and to increase the isolation between the metal layer 102 and the conductive layer 110. The conductive layer 110, preferably including TiN, is later used as an etching mask.

Figure 4B:
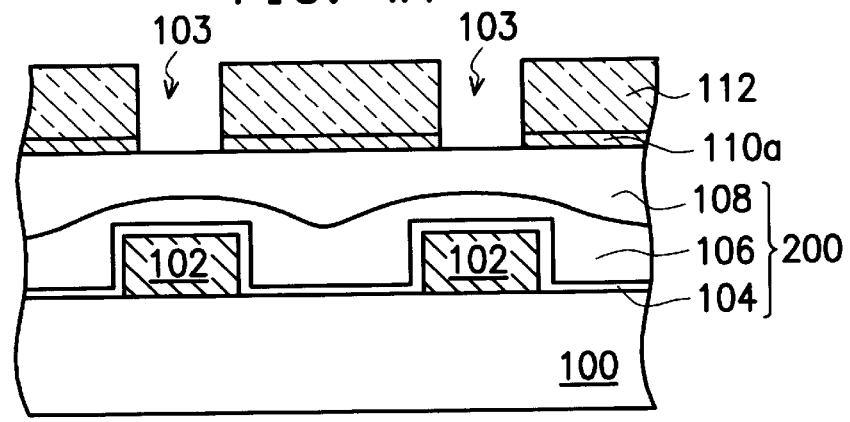

In FIG. 4B, a photoresist layer 112 is formed over the conductive layer 110 to pattern the conductive layer 110. An opening 103 is formed on the conductive layer 110 by an etching process such as dry etching, to expose the oxide layer 108. The conductive layer 110 with the opening 103 becomes a conductive layer 110a. The opening 103 is to be later used for forming a via.

Figure 4C:
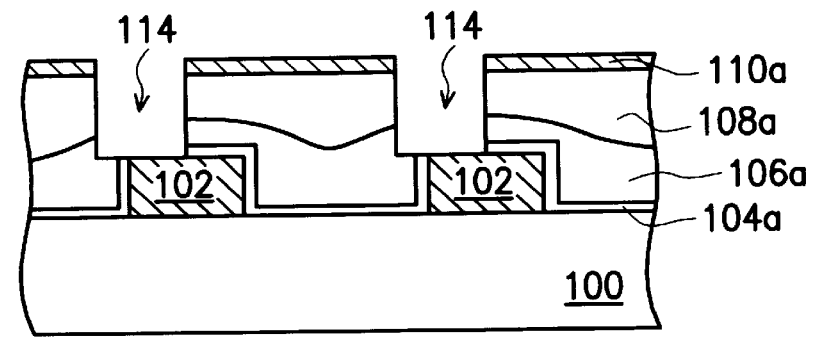

In FIG. 4C, the photoresist layer 112 is removed by conventional oxygen plasma ashing and wet chemical stripping. At this stage, since the inter-metal dielectric layer 200 is not yet etched, the FOx layer 106 is not exposed to the environments wherein oxygen plasma ashing and wet chemical stripping are performed. Therefore, via poisoning is prevented. Using the conductive layer 110a as an etching mask, the inter-metal dielectric layer 200 is etched to form a via 114, which exposes the metal layer 102. Dry etching is preferably used. The via 114 is to be used for forming a metal plug. The surface of the metal layer 102 usually has an anti-reflection layer (ARL), such as a TiN layer, which is also etched through.

Figure 4D:
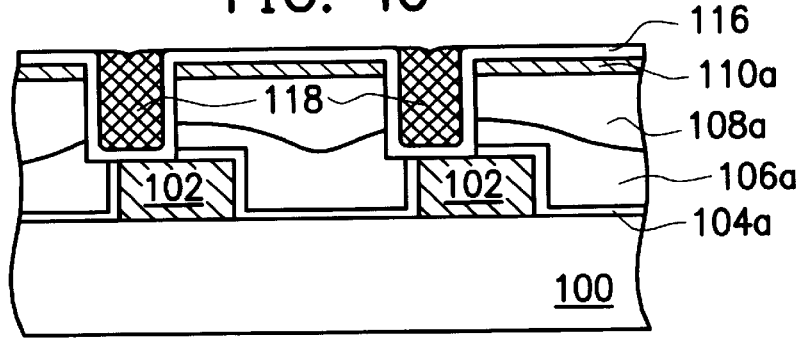

In FIG. 4D, a conventional process for forming the metal plug, preferably made of W such as a W-plug 118, on the via 114 is next performed in the following manner. A glue layer 116 is formed by, for example, sputtering over the substrate 100 with a material such as Ti/TiN. The Ti should have a thickness of about 200 Å~500 Å and the TiN should have a thickness of about 200 Å~800 Å. Then, the W-plug 118 is formed by depositing tungsten (W) into the via 114 and polishing the substrate 100 with a chemical mechanical polishing process. Here, the conductive layer 110a need not be removed before forming the glue layer 116 so that fabrication costs are reduced.

The method of the first preferred embodiment as described above can be applied in the fabrication of an unlanded via, because the FOx layer 106 does not come into direct contact with the solvent used in wet etching for removing the photoresist 112. Moreover, since the FOx layer 106 is not damaged by oxygen plasma ashing and wet chemical stripping, it doesn't absorb moisture so that the via 114 is not poisoned. The furnace baking and degassing process is also therefore not needed in the invention. Furthermore, the precision of photolithography is also not strictly required because a firm unlanded via is formed.

EXAMPLE 2

FIGS. 5A–5D are cross sectional views of a second preferred embodiment of the invention schematically illustrating the fabrication flow. The like reference numbers represent like objects.

Figure 5A:
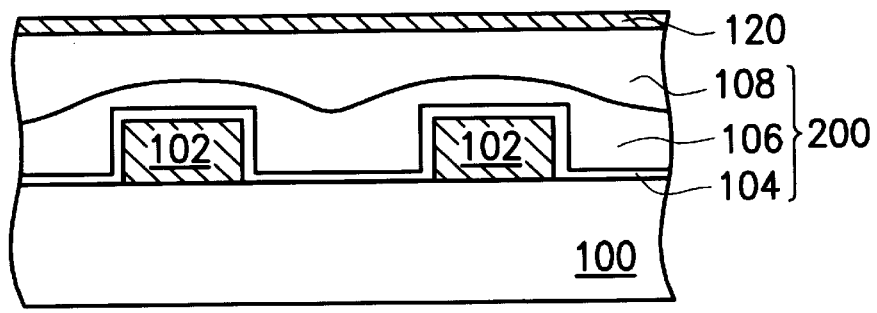
FIGS. 5A–5D are cross sectional views of a via of a second preferred embodiment of the invention schematically illustrating the fabrication flow.

In FIG. 5A, the fabricating processes are similar to the processes in FIG. 4A except a dielectric layer 120, which is in place of the conductive layer 110. The dielectric layer 120 preferably includes silicon nitride and is later used as an etching mask to form a via.

Figure 5B:
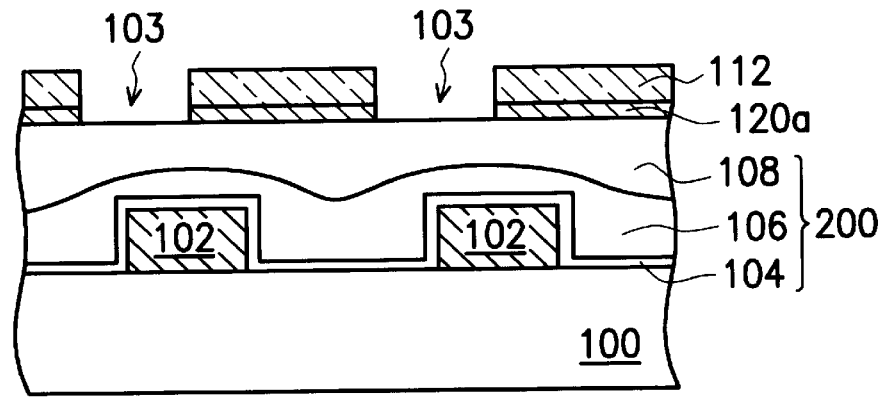

In FIG. 5B, a photoresist layer 112 is formed over the dielectric layer 120 to pattern it. An opening 103 is formed on the dielectric layer 120 by an etching process, such as dry etching, to expose the oxide layer 108. The dielectric layer 120, with the opening 103 becomes a dielectric layer 120a. The opening 103 is later used to form a via.

Figure 5C:
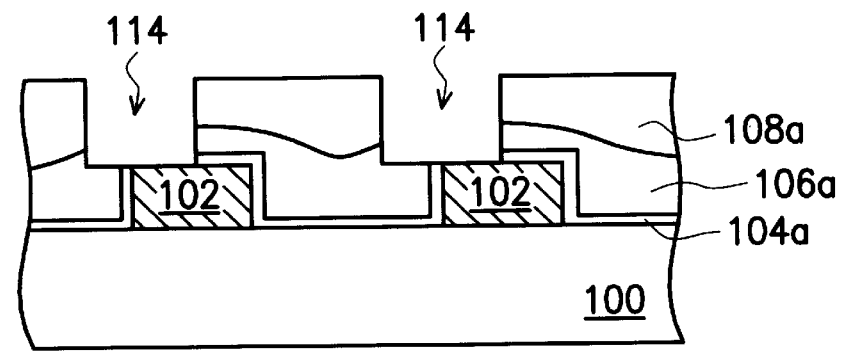

In FIG. 5C, after patterning, the photoresist layer 112 is removed by conventional oxygen plasma ashing and wet chemical stripping. At this stage, since the inter-metal dielectric layer 200 is not yet etched, the FOx layer 106 is not exposed to the environments wherein f oxygen plasma ashing and wet chemical stripping are performed. Therefore, via poisoning is avoided.

Using the dielectric layer 120a as an etching mask, the inter-metal dielectric layer 200, as shown in FIG. 5B, is etched to form a via 114, which exposes the metal layer 102. Dry etching is preferably used. After the via 114 is formed, the dielectric layer 120a is removed, preferably by wet etching. The via 114 is used to form a metal plug.

The surface of the metal layer 102 usually has an anti-reflection layer (ARL), such as a TiN layer, which is also etched through.

Figure 5D:
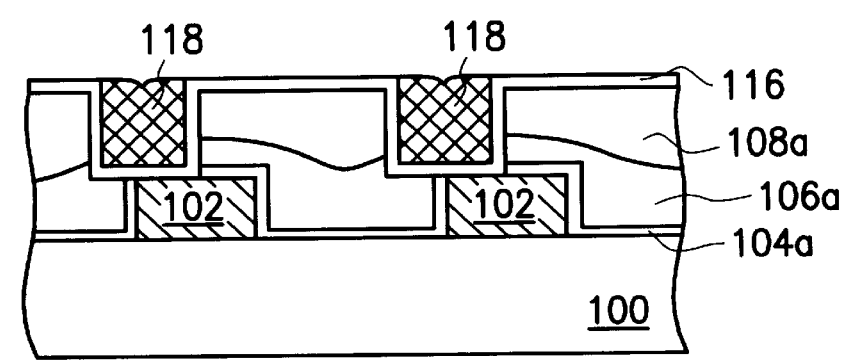

In FIG. 5D, the processes to form the metal plug, preferably made of W such as a W-plug 118, are the same as the processes described in FIG. 4 and are not repeated here.

In this second preferred embodiment, the dielectric layer 120a includes silicon nitride and is used as the etching mask. Compared with the first preferred embodiment, silicon nitride relative to oxide has a better masking function than TiN relative to oxide. When it is desired to etch through the ARL made of TiN on the metal layer 102, there is no possibility that the dielectric layer 120a, the silicon nitride etching mask, could be etched through to expose the oxide layer 108 before the via 114 is formed. Moreover, the invention has more relaxed photolithography precision requirements because a firm, unlanded via is applied.

EXAMPLE 3

FIGS. 6A–6D are cross sectional views of a via of a third preferred embodiment of the invention schematically illustrating the fabrication flow. The like reference numbers represent like objects.

Figure 6A:
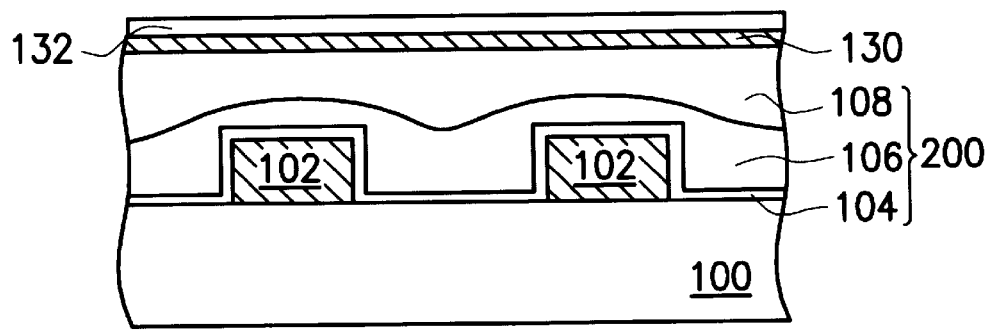
FIGS. 6A–6D are cross sectional views of a via of a third preferred embodiment of the invention schematically illustrating the fabrication flow.
Figure 6B:
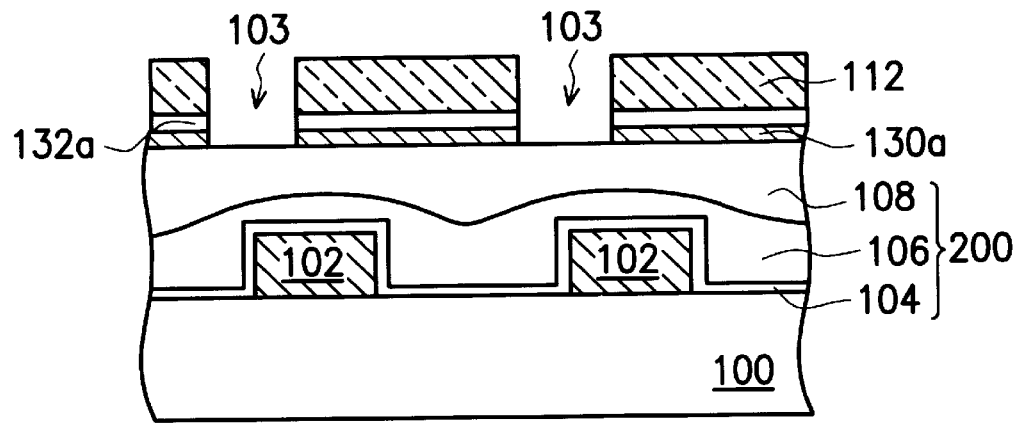

In FIG. 6A, the fabricating processes are similar to the processes in FIG. 4A except for conductive layer 130, which replaces conductive layer 110, and a dielectric layer 132, formed over the conductive layer. The conductive layer 130 preferably includes TiN with a thickness of about between 500 Å and 1000 Å and the dielectric layer 132 preferably includes $SiO_2$ with a thickness of about between 1000 Å and 2000 Å. Both the conductive layer 130 and the dielectric layer 132 are later used as an etching mask to form a via. In FIG. 6B, a photoresist layer 112 is formed over the dielectric layer 132 to pattern both the conductive layer 130 and the dielectric layer 132. An opening 103 is then formed by an etching process, such as dry etching, to expose the oxide layer 108. The conductive layer 130 and the dielectric layer 132, with the opening 103, becomes a conductive layer 130a and a dielectric layer 132a. The opening 103 is later used to form a via.

Figure 6C:
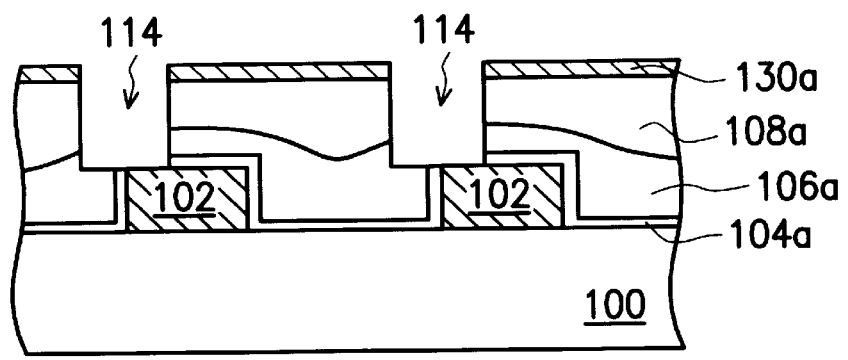

In FIG. 6C, after patterning, the photoresist layer 112 is removed by conventional oxygen plasma ashing and wet chemical stripping. At this stage, since the inter-metal dielectric layer 200 is not yet etched, the FOx layer 106 is not exposed to the environments wherein oxygen plasma ashing and wet chemical stripping are performed. Therefore, via poisoning is prevented.

Using the conductive layer 130a and the dielectric layer 132a as an etching mask, the inter-metal dielectric layer 200 is etched to form a via 114, which exposes the metal layer 102. Dry etching is preferably used. In this third preferred embodiment, the dielectric layer 132a is a sacrificial layer and is to be simultaneously removed during etching so that the etching conditions are more relaxed and the fabrication costs can be brought down. The via 114 is used for forming a metal plug. In addition, the surface of the metal layer 102 usually has an anti-reflection layer (ARL), such as a TiN layer, which is also etched through.

Figure 6D:
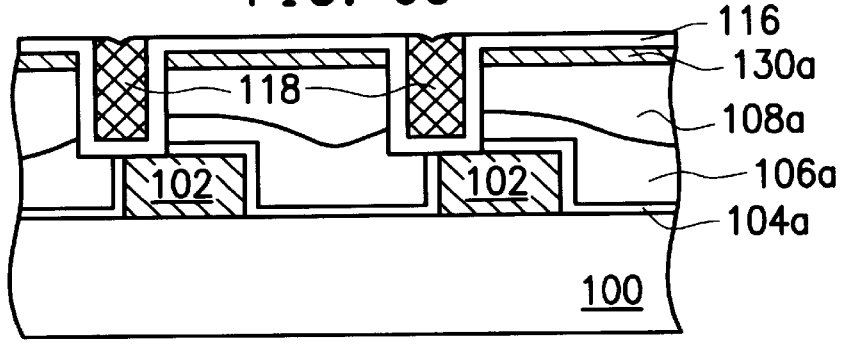

In FIG. 6D, the processes to form the metal plug, preferably made of W, such as a W-plug 118, are the same as the processes described in FIG. 4, and are not repeated here.

In this third preferred embodiment, the dielectric layer 132a is a sacrificial layer and is simultaneously removed during etching. Therefore there is no need of a high etching selectivity between the TiN conductive layer 130a and the oxide layer 108a of the inter-metal dielectric layer 200. Moreover, the TiN etching mask, that is, the TiN conductive layer 130a, is retained and combined together with the Ti/TiN glue layer 116 as the glue layer for the W-plug 118. Furthermore, the invention has more relaxed photolithography precision requirements because a firm unlanded via is formed.

In conclusion, the invention is characterized as follows:

1. The fabrication method in the invention uses the conductive layer as the etching mask to form the via. The photoresist layer 112, used to form the etching mask, is removed before the via 114 is etched. Therefore, via poisoning and other problems related to the exposure of the FOx layer 108 to the oxygen plasma ashing and wet chemical stripping environments, used in removing the photoresist layer 112, are avoided.

2. The fabrication method in the invention uses the conductive layer as the etching mask to form the via. The conductive layer is not necessarily removed after the via is formed so that the fabrication process is simplified and the fabrication costs are brought down.

3. The fabrication method in the invention uses the silicon nitride layer as the etching mask for forming the via. The photoresist layer 112, used to form the etching mask, is removed before the via 114 is etched. Therefore, via poisoning and other problems related to the exposure of the FOx layer 108 to the oxygen plasma ashing and wet chemical stripping environments, used in removing the photoresist layer 112, are avoided.

4. The fabrication method in the invention uses the oxide layer and the conductive layer as the etching mask for forming the via. The photoresist layer 112, used to form the etching mask, is removed before the via 114 is etched. Therefore via poisoning and problems related to the exposure of the FOx layer 108 to the oxygen plasma ashing and wet chemical stripping environments, used in removing the photoresist layer 112, are avoided.

5. The fabrication method in the invention uses the oxide layer and the conductive layer as the etching mask for forming the via, wherein the oxide layer is a sacrificial layer. So, there is no need for a high etching selectivity between the conductive layer 130a and the oxide layer 108a of the inter-metal dielectric layer 200. Strict etching conditions are not necessary in the fabrication process, and as a result, fabrication costs are lower.

The invention has been described using exemplary preferred embodiments. However, it is to be understood that the scope of the invention is not limited to the disclosed embodiment. On the contrary, it is intended to cover various modifications and similar arrangements. The scope of the claims therefore, should be accorded the broadest interpretation so as to encompass all such modifications and similar arrangements.

What is claimed is:

1. A method for fabricating a via over a semiconductor substrate, the method comprising:

forming a metal layer on the substrate;
   forming a flowable oxide layer over the substrate to cover the metal layer;
   forming a first dielectric layer over the flowable oxide layer;
   forming a second dielectric layer over the first dielectric layer;
   patterning the second dielectric layer to form an etching mask, wherein a photoresist layer is used for patterning;
   removing the photoresist layer before the etching mask is used; and
   using the etching mask to pattern the first dielectric layer and the flowable oxide layer to form the via, which exposes the metal layer.

2. The method of claim 1, wherein the step of forming the flowable oxide layer further comprises a liner oxide layer formed over the substrate before the flowable oxide layer is formed.

3. The method of claim 1, wherein the step of forming the first dielectric layer comprises plasma enhanced chemical vapor deposition (PECVD).

4. The method of claim 3, wherein the first dielectric layer comprises oxide.

5. The method of claim 1, wherein the first dielectric layer comprises a different material from the second dielectric layer.

6. The method of claim 1, wherein the second dielectric layer comprises silicon nitride.

7. The method of claim 1, wherein the step of patterning the second dielectric layer comprises photolithography and etching.

8. The method of claim 1, wherein the step of removing the photoresist comprises oxygen plasma ashing and wet chemical stripping.

9. The method of claim 1, wherein the via is filled with a conductive material to form a metal plug.

10. The method of claim 9, wherein before the via is filled with the conductive material, the second dielectric layer is removed.

11. A method for fabricating a via over a semiconductor substrate, the method comprising:

forming a metal layer on the substrate;
    forming a flowable oxide layer over the substrate to cover the metal layer;
    forming a first dielectric layer over the flowable oxide layer;
    forming a conductive layer over the first dielectric layer;
    forming a second dielectric layer over the first dielectric layer;
    patterning the second dielectric layer and the conductive layer to form an etching mask, wherein a photoresist layer is used for patterning;
    removing the photoresist layer before the etching mask is used; and
    using the etching mask to pattern the first dielectric layer and the flowable oxide layer to form the via, which exposes the metal layer.

12. The method of claim 11, wherein the step of forming the flowable oxide layer further comprises a liner oxide layer formed over the substrate before the flowable oxide layer formed.

13. The method of claim 11, wherein the step of forming the first dielectric layer comprises plasma enhanced chemical vapor deposition (PFCVD).

14. The method of claim 13, wherein the first dielectric layer comprises oxide.

15. The method of claim 11, wherein the second dielectric layer comprises silicon nitride.

16. The method of claim 11, wherein the conductive layer comprises TiN.

17. The method of claim 11, wherein the step of patterning the second dielectric layer comprises photolithography and etching.

18. The method of claim 11, wherein the step of removing the photoresist comprises oxygen plasma ashing and wet chemical stripping.

19. The method of claim 11, wherein the second dielectric layer is removed during the step of patterning the first dielectric layer and the conductive layer.

* * * * *